(12) United States Patent
Kapusta et al.

(10) Patent No.: US 7,999,585 B2
(45) Date of Patent: Aug. 16, 2011

(54) CALIBRATING MULTIPLYING-DELAY-LOCKED-LOOPS (MDLLS)

(75) Inventors: Ronald A. Kapusta, Waltham, MA (US); Doris Lin, Cambridge, MA (US); Jianrong Chen, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 64 days.

(21) Appl. No.: 12/536,272

(22) Filed: Aug. 5, 2009

(65) Prior Publication Data

US 2010/0327925 A1 Dec. 30, 2010

Related U.S. Application Data

(60) Provisional application No. 61/220,283, filed on Jun. 25, 2009.

(51) Int. Cl.
*H03L 7/06* (2006.01)
(52) U.S. Cl. ........................ 327/158; 327/149
(58) Field of Classification Search ............... 327/149, 327/158
See application file for complete search history.

(56) References Cited

U.S. PATENT DOCUMENTS

| | | | |
|---|---|---|---|
| 5,465,076 A | 11/1995 | Yamauchi et al. | |
| 6,208,183 B1* | 3/2001 | Li et al. | 327/161 |
| 6,292,040 B1* | 9/2001 | Iwamoto et al. | 327/158 |
| 7,095,261 B2* | 8/2006 | Drexler et al. | 327/158 |
| 7,190,201 B2 | 3/2007 | Haerie et al. | |
| 7,368,965 B2* | 5/2008 | Drexler et al. | 327/158 |
| 7,423,462 B2* | 9/2008 | Drexler et al. | 327/158 |
| 7,423,463 B2* | 9/2008 | Drexler et al. | 327/158 |
| 7,489,171 B2* | 2/2009 | Song | 327/158 |
| 7,495,487 B2* | 2/2009 | Ma et al. | 327/158 |
| 7,583,119 B2* | 9/2009 | Song | 327/158 |
| 7,619,453 B2* | 11/2009 | Ma et al. | 327/158 |
| 7,671,648 B2* | 3/2010 | Kwak | 327/158 |
| 7,812,593 B2* | 10/2010 | Lin et al. | 324/76.53 |
| 2002/0041196 A1 | 4/2002 | Demone et al. | |
| 2006/0033544 A1 | 2/2006 | Hul et al. | |
| 2008/0123445 A1 | 5/2008 | Vergnes et al. | |
| 2008/0205550 A1 | 8/2008 | Rofougaran | |

(Continued)

OTHER PUBLICATIONS

Helal et al., "A Highly Digital MDLL-Based Clock Multiplier That Leverages a Self-Scrambling Time-to-Digital Converter to Achieve Subpicosecond Jitter Performance", IEEE Journal of Solid-State Circuits, 43(4): 855-863.
PCT International Search Report and Written Opinion from PCT/US10/37175, mailed on Aug. 11, 2010.

*Primary Examiner* — Lincoln Donovan
*Assistant Examiner* — Adam D Houston
(74) *Attorney, Agent, or Firm* — Kenyon & Kenyon LLP

(57) ABSTRACT

Devices and methods for varying individual periods or cycle times of upconverted clock signals within a corresponding reference clock cycle are disclosed. In some embodiments, these varying cycle times may improve signal synchronization between the upconverted clock and the reference clock. In different embodiments, different types of counters and counting circuits keep track of the number of elapsed upconverted clock cycles in order to determine the specific upconverted clock cycles with longer cycle times. In some embodiments, a signal may be sent to a delay line to change the amount of delay between upconverted clock pulses, thereby increasing or decreasing a specific upconverted clock cycle time or period. In some embodiments the specific upconverted clock cycle(s) changed in each reference clock cycle may vary, which may further improve reconciliation between the upconverted clock cycles and the corresponding reference clock cycle.

17 Claims, 9 Drawing Sheets

U.S. PATENT DOCUMENTS

| | | | |
|---|---|---|---|
| 2008/0246520 A1* | 10/2008 | Ma et al. | 327/158 |
| 2009/0146712 A1* | 6/2009 | Ma et al. | 327/158 |
| 2010/0134166 A1* | 6/2010 | Kwak | 327/158 |
| 2010/0156459 A1* | 6/2010 | Plants et al. | 326/39 |
| 2010/0321076 A1* | 12/2010 | Bae et al. | 327/158 |
| 2011/0002181 A1* | 1/2011 | Rhee et al. | 365/194 |

* cited by examiner

Prior Art

| Time | Tap Select 48 | Counter 43 | Summer 44 | Delay Control 69 |
|---|---|---|---|---|
| 60 | 0010.01 | 00 | 0010.01 | 0010 |
| 61 | 0010.01 | 01 | 0010.10 | 0010 |
| 62 | 0010.01 | 10 | 0010.11 | 0010 |
| 63 | 0010.01 | 11 | 0011.00 | 0011 |

| Time | Fractional Tap Bits 77 | Shift Register 71 | Shift Register 72 | Shift Register 73 | Delay Control 78 |
|---|---|---|---|---|---|
| 91 | 00 | 1 | 0 | 0 | 0 |
| 92 | -- | 1 | 1 | 0 | 0 |
| 93 | -- | 1 | 1 | 1 | 1 |
| 94 | 00 | 1 | 0 | 0 | 0 |

CALIBRATING MULTIPLYING-DELAY-LOCKED-LOOPS (MDLLS)

REFERENCE TO RELATED APPLICATIONS

This application claims priority to U.S. Provisional Application No. 61/220,283, filed Jun. 25, 2009, the contents of which are incorporated herein by reference in its entirety.

BACKGROUND

Clock rates in electronic devices may determine the rate at which digital bits may be processed. A faster clock rate may enable more digital bits to be processed by an electronic device. Multiplying-delay-locked-loops (MDLLs) are often used to upconvert clocks from slower clocks by multiplying the slower clock by a predetermined scaling factor. For example, a reference clock operating at 10 MHz has a 100 ns period. If a faster clock uses scaling factor of eight, or 8×, it is desirable to have the faster clock operate at 80 MHz having a period of 12.5 ns so that eight faster clock cycles will synchronize with one reference clock cycle.

FIG. 1 shows an exemplary multiplying-delay-locked-loop circuit using a counter 13 and multiplexer (MUX) 11 with a delay line 12 to scale the upconverted clock signal 14 to the reference clock signal 10. The MUX 11 may select an input signal from one of its inputs to propagate further into the MDLL—a reference clock from input 10 or an output clock from terminal 14. The delay lines 12 may impose delay on propagation of its input signal in an amount determined by an input control signal. The delay line 12 may include a plurality of delay elements which, if selected, delays the input signal by a predetermined amount. The counter 13 may increment on each rising (or falling) edge of the output clock signal 14 and may generate a STOP output when the count value reaches a threshold count value representing the scaling factor applied by the MDLL. For example, for a 10× clock, the count value may be set to 10; the MUX 11 may be selected to recirculate an output of the delay line 12 back to the delay line 12 until the tenth cycle when the counter 13 asserts the STOP signal line. Thereafter, the MUX 11 may be switched to the reference clock input 10 and operation ceases until a new clock edge appears in the reference clock signal. In this manner, the MDLL generates a high speed clock having a predetermined number of clock cycles for each clock cycle of a reference clock.

Ideally, given a scaling factor of N, edges within the reference clock would coincide perfectly with an edge of a clock signal output at terminal 14. Such coincidence does not always occur, for example, if the delays imposed by the delay line 12 are not tuned appropriately for the clock scaling factor. If, for example, the delay line 12 does not impose sufficient delay on the recycled clock cycle that is outputted from the delay line 12, passed through MUX 11, and inputted back to the delay line 12, the counter 13 will reach its threshold count value before a new edge of the reference clock is received. In such a case, the MDLL waits in a dormant state until the reference clock edge is received, whereupon it resumes operation. By contrast, if the delay line 12 imposes too much delay, the counter 13 will not reach its threshold count value by the time the next edge appears in the reference clock signal. Both conditions introduce error in the MDLL's performance. Moreover, the amount of delay imposed by a delay line 12 can change based upon temperature, process, and operating voltage present in the integrated circuits in which the MDLL is operating. Thus, existing MDLLs include control systems (not shown in FIG. 1) to reconfigure the delay imposed by the delay line 12 and tune the MDLL to minimize such errors.

Known control systems detect a phase difference between the reference clock edge and a corresponding edge in the output clock and adjust an amount of delay imposed by the delay line 12 based on the detected difference. For example, the control block may increment or decrement a number of delay elements of the delay line 12 depending on whether the multiple upconverted clock cycles lag or lead the corresponding reference clock cycle. Another control block example may adjust the delay through each of a fixed number of delay elements.

The problem with these existing systems is that the delay line is reconfigured once per clock cycle of the reference clock. In an MDLL where N represents the upconversion factor of N (e.g. N=10 for a 10× clock) and $\Delta t$ represents the smallest adjustable increment of delay supported by the delay line, the conventional systems adjust delay by a factor of $2*N*\Delta t$. This may be too coarse a granularity to provide appropriate control of the MDLL.

FIG. 2 illustrates this problem. FIG. 2 shows a reference clock signal cycle 21 and the upconverted clock signals 22 and 23 corresponding to a first and second reference clock cycle respectively. In this example, the upconverted clock may be configured to be 4 times the reference clock, with ideally four fast clock cycles synchronized with one reference clock cycle.

During the first reference clock cycle, the control block may select a first set of delay elements resulting in the upconverted clock having a cycle period of 2D, so the time it takes to complete half a cycle is D. After complete four clock cycles, a total time of 8D, (2D per clock cycle times 4 clock cycles) will have elapsed. However, in this example, the reference clock cycle takes longer than time 8D to complete, resulting in a synchronization discrepancy 24 between the upconverted clock signal 22 and the reference clock signal 21. To reduce the discrepancy, the control block may add another delay element to each upconverted clock cycle 23 in the next reference clock cycle. This may increase the time to complete each upconverted clock cycle by 2x, and each half clock cycle by x. In this case, the total time to complete the four upconverted clock cycles will be 8*(D+x).

However, by adding the additional time 2x to each upconverted clock cycle, the time required to complete the four upconverted clock cycles may now take longer than the time to complete a reference clock cycle, resulting in another synchronization discrepancy 25. In this case, the control block may remove the delay element that it previously added, and the process may to continue to iterate in this fashion, switching between adding and removing delay elements in each reference clock cycle.

Thus, the ability of these existing systems to reconcile upconverted clock cycle times with a reference clock cycle time is limited, since the existing systems must change each upconverted clock cycle time within a reference cycle by the same minimum amount. In systems with large scaling factors resulting a large number of upconverted clock cycles corresponding to a reference clock cycle, these minimum amounts can add up quickly and further limit the ability of the control block to reconcile multiple upconverted clock cycles with the corresponding reference clock cycle.

There is a need for improved delay control where upconverted clock cycle periods may be adjusted with improved resolution to better reconcile multiple upconverted clock cycles with the corresponding reference cycle.

DETAILED DESCRIPTION

In an embodiment of the invention, the cycle times or periods of a subset of upconverted clock cycles corresponding to a given reference clock cycle may be changed independently of the other upconverted clock cycles in the given reference clock cycle. The cycle times of subsets of upconverted clock cycles may be changed in an embodiment by increasing or decrease the amount of delay in a delay line for the subset of upconverted clock cycles at a different rate than the other upconverted clock cycles. In some embodiments, different bits associated with different upconverted clock cycles within a given reference clock cycle may be added together; depending on the sum, the period or delay associated with each upconverted clock cycle may be increased, decrease, or remain unchanged. In other embodiments, different bits associated with different upconverted clock cycles may be sent through one or more shift registers activated by the upconverted clock signal. The different bits may contain instructions to increase, decrease, or not change the delay, while the shift registers may synchronize the instructions with the corresponding upconverted clock cycle in a given reference clock cycle.

Figure 1:
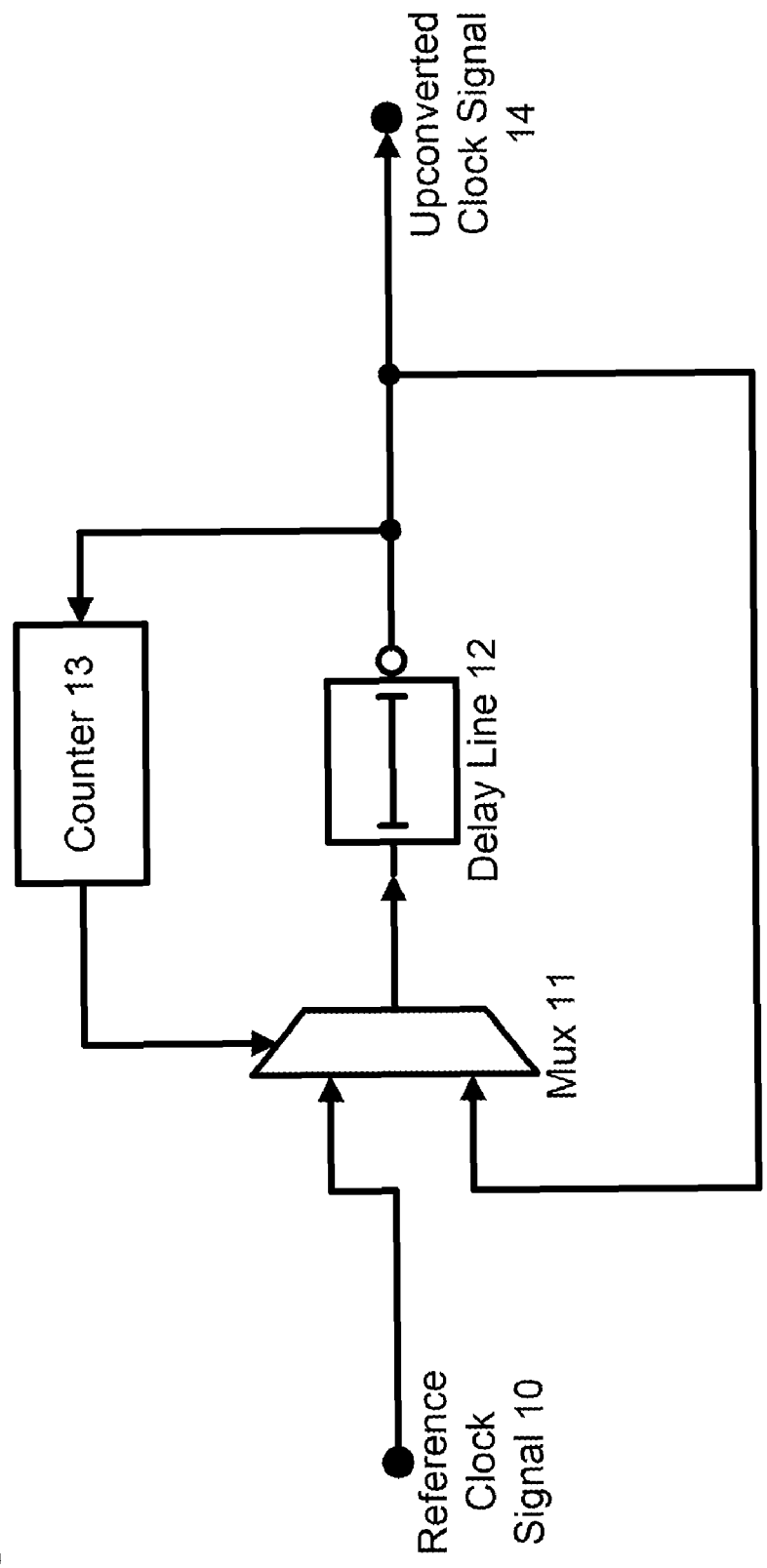
FIG. 1 shows an exemplary block diagram for a multiplying-delay-locked-loop.
Figure 2:
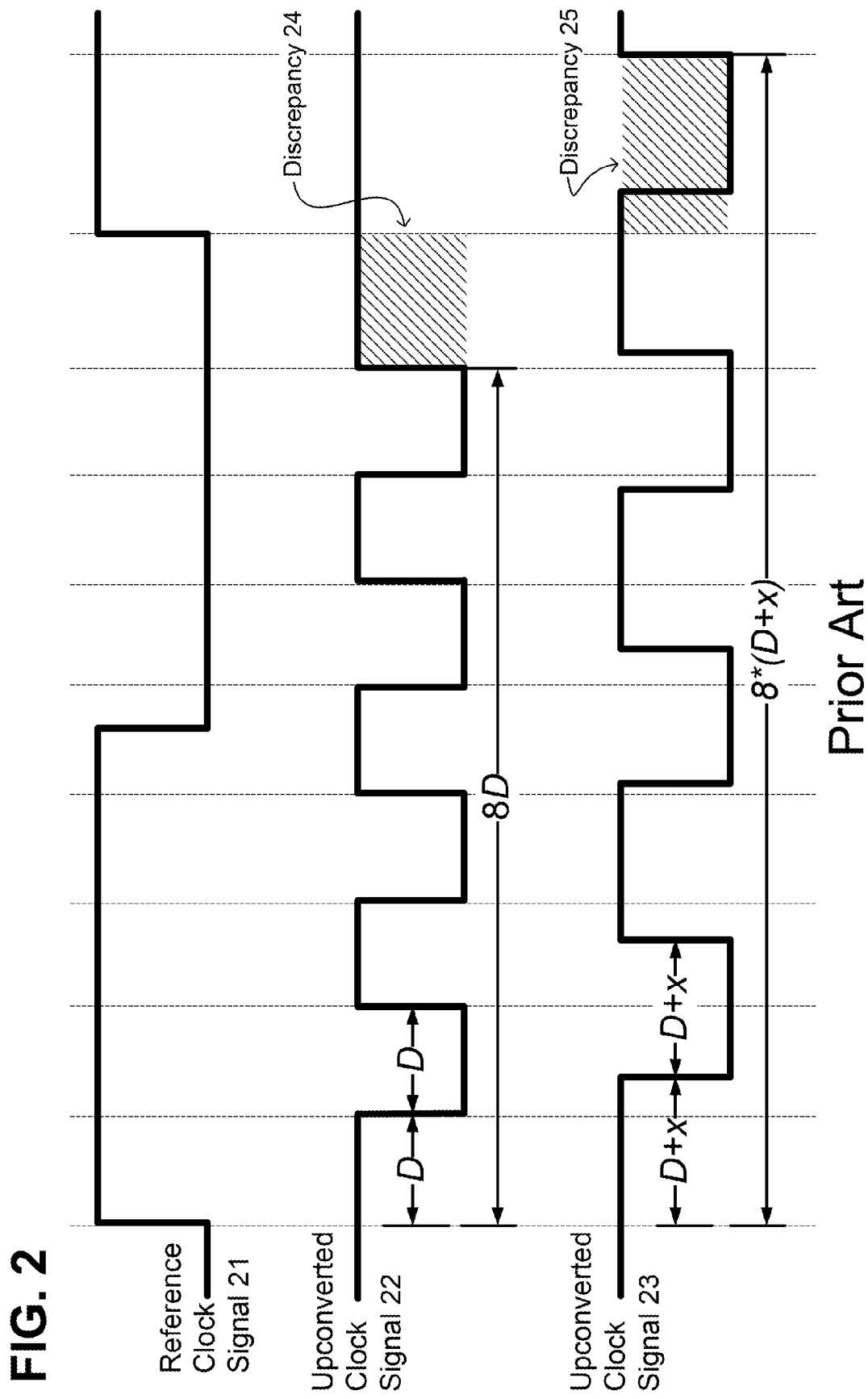
FIG. 2 shows exemplary upconverted clock output signals corresponding to a reference clock cycle in an existing device.
Figure 3:
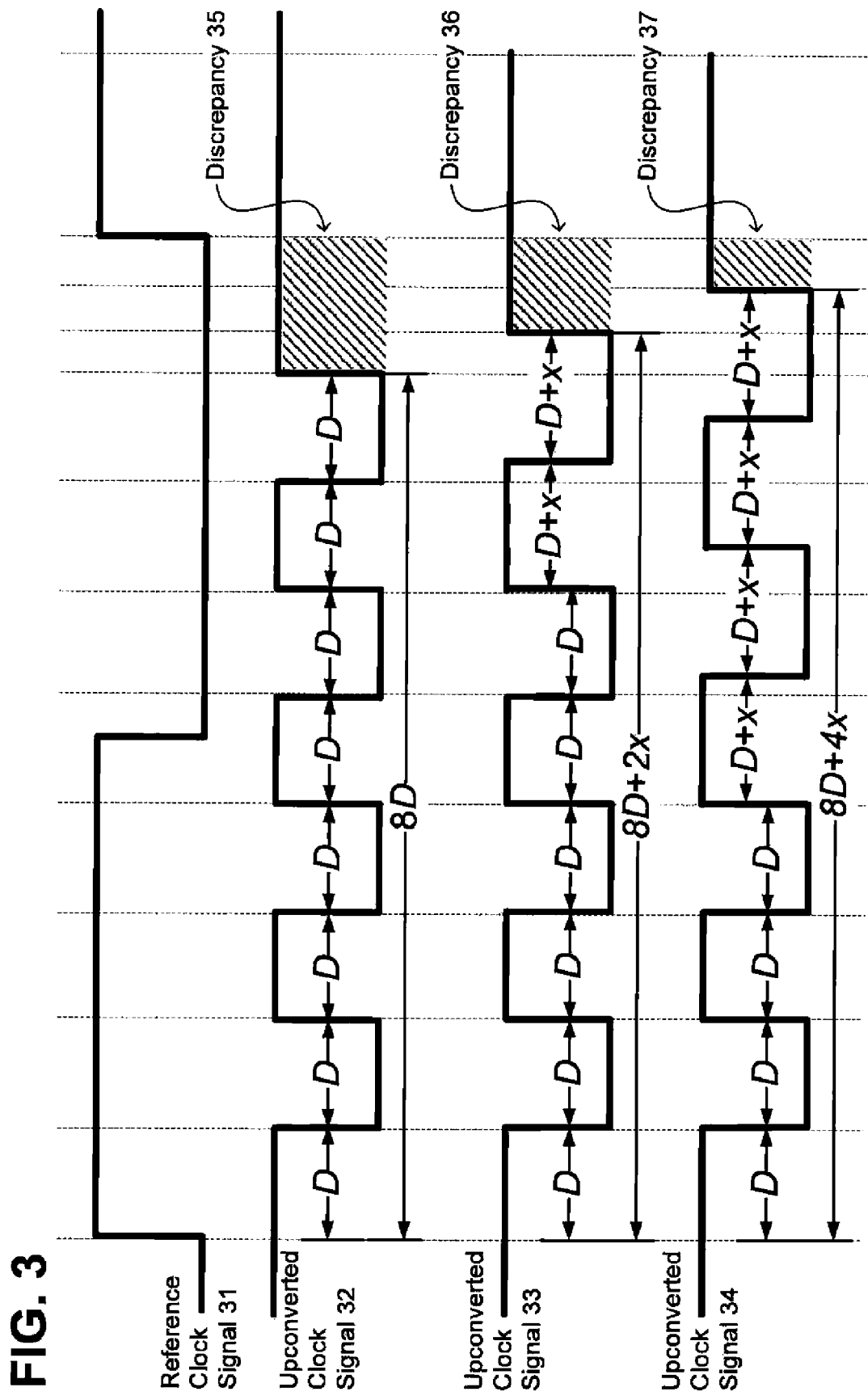
FIG. 3 shows exemplary upconverted clock output signals corresponding to a reference clock cycle in an embodiment of the invention.

FIG. 3 shows a reference clock signal cycle 31 and the upconverted clock signals 32, 33, and 34 corresponding to a first, second, and third reference clock cycle respectively, in an embodiment. In this exemplary embodiment, the upconverted clock is configured to be 4 times the reference clock, with ideally four upconverted clock cycles synchronized with one reference clock cycle, though in other embodiments the configuration may vary.

During the first reference clock cycle, the control block may select a first set of delay elements resulting in the upconverted clock having a cycle period of 2D in upconverted clock signal 32. After completing the four upconverted clock cycles, a total time of 8D, (2D per clock cycle times 4 clock cycles) will have elapsed, which may be less than the time need by the reference clock to complete its cycle, as shown in the shaded synchronization discrepancy region 35. In this case, a control block may add another delay element to only one upconverted clock cycle in the next reference clock cycle as shown in upconverted clock signal 33. This may increase the total time to complete this upconverted clock cycle by 2x, without changing the time to complete the other three clock cycles. The total time to complete the four upconverted clock cycles will now be 8D+2x, resulting in a reduced synchronization discrepancy region 36.

In some instances, this 2x time increase may still be less than that the total time required to complete one reference cycle. In this case, the control block may add another delay element to a second upconverted clock cycle in the third reference clock cycle as shown in upconverted clock signal 34. This may increase the total time to complete this second upconverted clock cycle by 2x, without changing the time to complete the other three clock cycles. Thus, the total time to complete these four upconverted clock cycles will now be 8D+4x, resulting in a further reduced synchronization discrepancy region 37 and improved upconverted clock signal resolution.

Different embodiments of the invention may continuing adding additional delay element(s) to one or more upconverted clock cycles in each subsequent reference clock cycle until the total time required to complete the upconverted clock cycles no longer lags the reference clock cycle time. In some embodiments, delay element(s) may also be removed from one or more upconverted clock cycles when the total time required to complete the upconverted clock cycles exceeds the reference clock cycle time. In other embodiments, the delay elements associated with each upconverted clock cycle may remain constant when the total time required to complete the upconverted clock cycles is synchronized to the reference clock cycle time.

Figure 4:
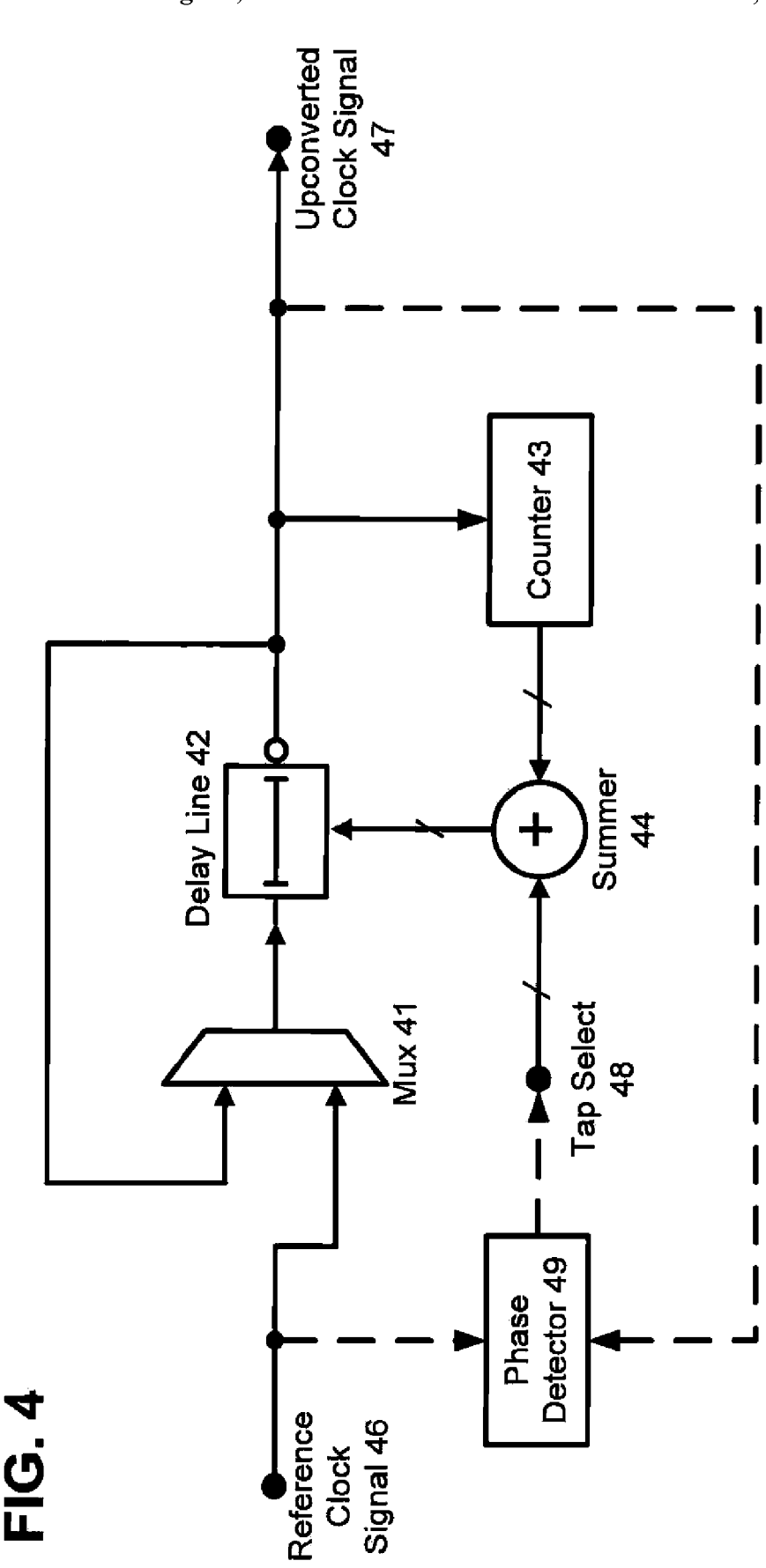
FIG. 4 shows a block diagram of an embodiment of the invention.

FIG. 4 shows an embodiment of the invention for controlling the number of delay elements in different upconverted clock cycles corresponding to a given reference clock cycle. In an embodiment, a reference clock 46 may be coupled to an input of a MUX 41. The output of the MUX 41 may be coupled to a delay line 42, with the output of the delay line 42 coupled to a second MUX 41 input.

In an embodiment, delay line 42 may comprise $2^N$ delay elements. The number of these $2^N$ delay elements that are actually used to delay a signal may vary on demand through a tap select or delay control, which may reroute a signal through additional or less delay elements to increase or decrease the delay time. In some embodiments with $2^N$ delay elements, an N-bit tap select word may be used to increase or decrease the amount of delay by redirecting a signal through different delay elements in the delay line.

Some exemplary delay lines that may be used with the present invention are disclosed in co-pending application Ser. No. 12/536,285, entitled "Improving Digital Delay Lines," filed Aug. 5, 2009, and assigned to Analog Devices, Inc., the assignee of this application. The contents of this co-pending application are incorporated by reference herein.

As illustrated in FIG. 4, an embodiment may include a delay line controller that may include a tap selector 48, a counter 43 and an adder 44. The tap selector 48 may generate an N+X bit tap select control word representing a delay to be applied by the delay line. The adder 44 may perform an addition between the control word from the tap selector 48 and an X bit count value from the counter 43. The N most significant bits from this addition may be applied to the delay line 42 as a configuration signal. The counter 43 may be reset on every reference clock cycle by a control line (not shown).

In some embodiments, the tap selector 48 may generate its control word based on initial configuration settings and an accumulation of any error signals generated from prior comparisons of the reference clock and the upconverted clock. This accumulation of error signals may be measured in some embodiments by a phase detector 49 which may compare a reference clock cycle time to corresponding upconverted clock cycle times and cause a change the control word sent to the delay line 42. In an embodiment, the change to the control word may result in an increased delay when the corresponding upconverted clock cycles lag the reference clock cycle, decreased delay when the upconverted cycles lead the reference clock cycle, and/or no change to the delay when the corresponding upconverted clock cycles coincide with the reference clock cycle.

The N most significant bits of the tap select may be viewed as a base number of delay elements to be engaged from the delay line 42 at the beginning of each reference clock cycle. The X least significant bits may be viewed as seed bits that determine at what point within the reference clock cycle the settings to the delay line will be revised. When the addition of the X bit value from the tap selector 48 and the X bit count value from the counter 43 causes a carry into the Nth most significant bit, it will cause a reconfiguration of the delay line 42 that adds a delay stage. Thus, a first number of cycles of the upconverted clock will be performed with a base number of delay stages that have been engaged within the delay line (hypothetically, 25 stages). After the count value reaches a point where its addition to the X LSBs of the tap select control value causes a carry, the remaining cycles of the upconverted clock will be operated with a new number of delay stages having been engaged within the delay line (e.g., 26 stages). Operation may continue with the reconfigured delay line until the current cycle of the reference cycle concludes, whereupon the counter 43 may be reset.

During operation, the tap selector 48 may generate new control words on each cycle of the reference clock. Thus, when the counter 43 is reset, the tap selector 48 also may revise its N+X control value based on early/late decisions from a phase detector 49. Revision to the tap select control word may cause the delay line controller 40 to reconfigure the delay line at different times during the reference clock cycle when considered on a cycle-by-cycle basis.

In an embodiment, the summer 44 may add the X bit output from the counter 43 to the N+X bit tap select output 48 containing the appended X bits to the N bit control word. In an embodiment, the result of this addition may be truncated, removing the X least significant bits. Truncating the summed amount by the same number of X bits as previous appended to the N bit control word will provide a result with the same number of bits as the original N bit control word.

In an embodiment, the truncated N bit output from the summer 44 may be sent to a control of delay line 42 to select the appropriate delay elements. In embodiments where the counter 43 has the same number of bits as appended to the N-bit tap select word, the truncated output from the summer 44 will either have the same value as the N-bit tap select word, or be one bit greater than the N-bit tap select word. This is because the sum of the counter and the appended bits will either cause a carryover into the bits of N-bit tap select word, resulting the N-bit tap select word to be incremented by one bit, or cause no carryover, in which case the N-bit tap select word remains unchanged.

Figure 5:
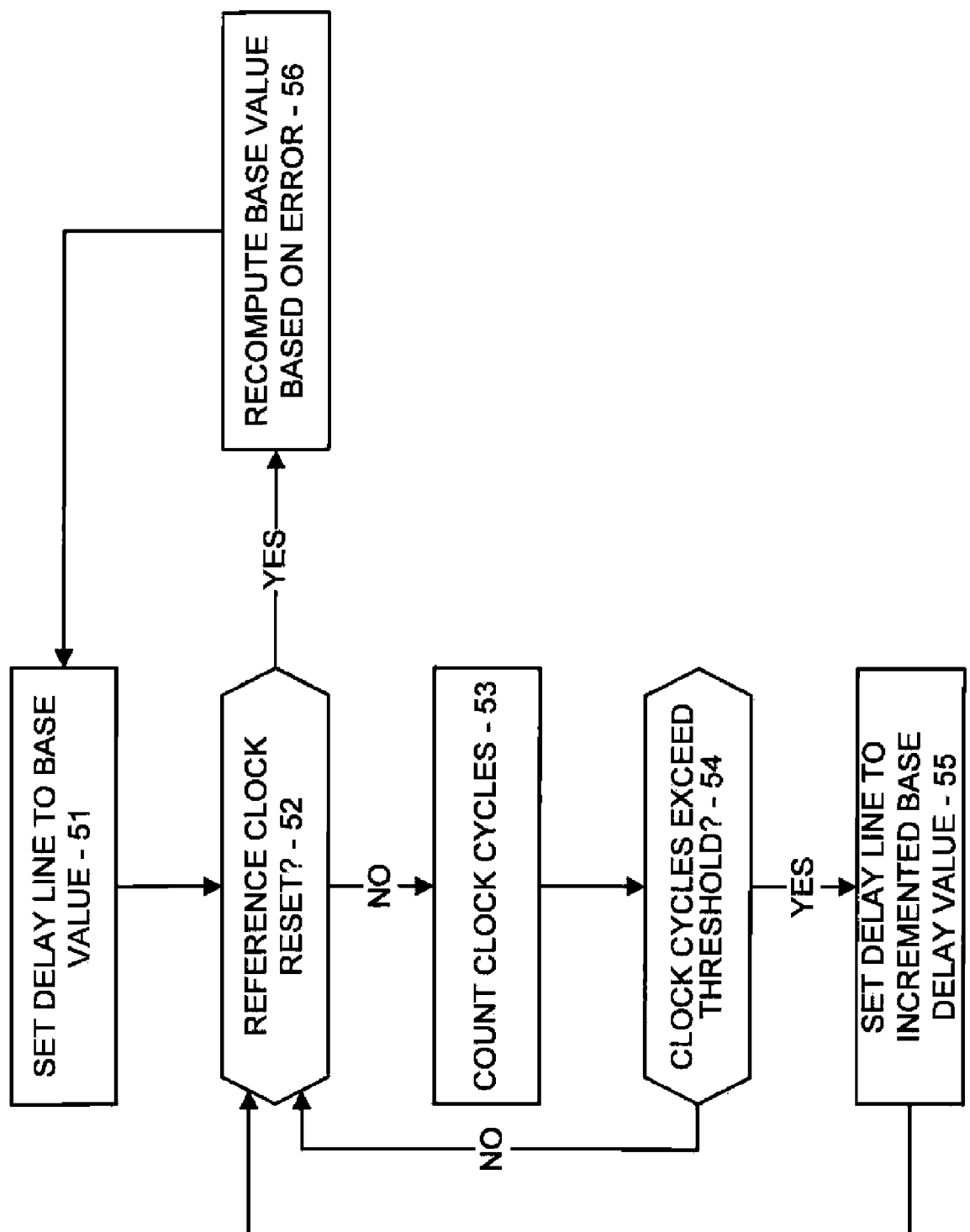
FIG. 5 shows exemplary process steps in an embodiment of the invention.

FIG. 5 shows a process that a circuit, such as the circuit shown in FIG. 4, may follow when modifying the delay of a subset of upconverted clock cycles. In step 51, the delay line may be set to a base value by selecting an initial control word. In step 52, a check may be performed to determine whether the reference clock has begun a new clock cycle or has been otherwise reset.

When the reference clock has not begun a new cycle or been otherwise reset, a quantity of upconverted clock cycles may be counted in step 53. In step 54, the counted quantity of upconverted cycles may be compared to a threshold, and when the threshold is reached, the base value of the delay line control word may be incremented in step 55 to increase the delay. When either the base value of the delay has been incremented in step 55 or the threshold in step 54 is not reached, the process may return to step 52 to check whether the reference clock has begun a new cycle or has been reset.

When the reference clock has been reset or a new reference clock cycle occurs during step 52, the base value of the delay line control word may be incremented, decremented, or remain constant depending on whether the upconverted clock cycles lag, lead, or coincide with the reference clock cycle. The process may then continue to step 51, where the delay line may be set to the recalculated control word base value.

Figure 6:
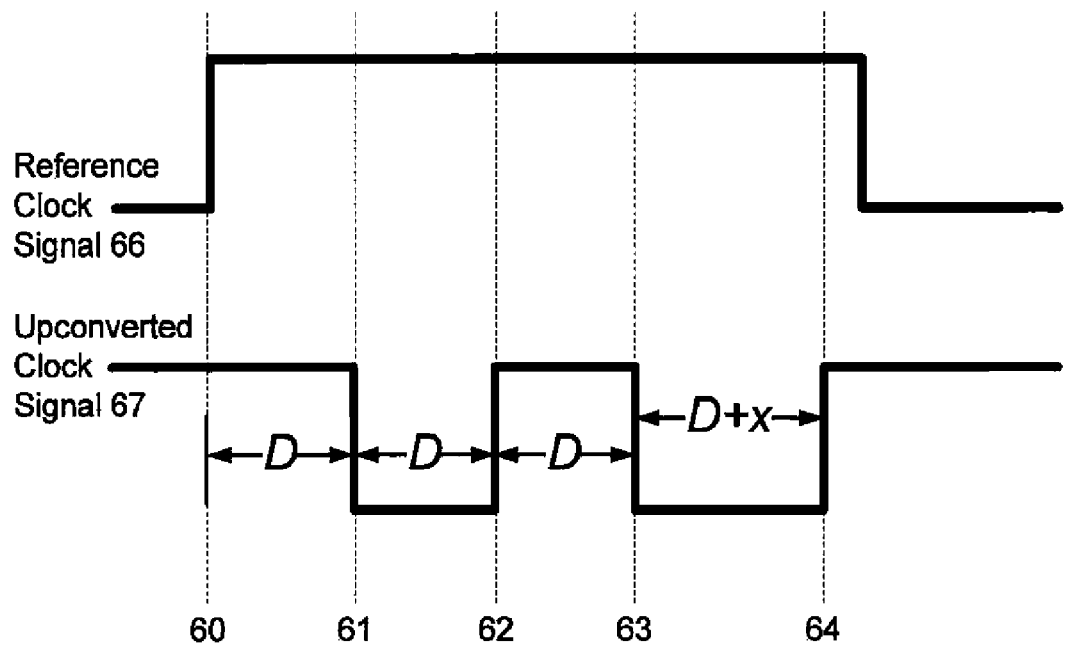
FIG. 6 shows an exemplary upconverted clock output signal corresponding to a reference clock signal together with changes in bit values over time of various elements of the embodiment in FIG. 4.

FIG. 6 shows how the circuit in FIG. 4 can be used in an embodiment to control the number of delay elements in different upconverted clock cycles corresponding to a given reference clock cycle. In this exemplary embodiment, we have an inverting delay line with 16 or $2^4$ delay elements, so we will have a 4-bit tap select word (N=4), to which we append two additional bits (X=2). In this example, we will start off with the tap select word "0010" and the two appended bits "01." For illustrative purposes to distinguish the tap select word from the appended bits we will show the tap select output 48 as "0010.01" instead of "001001". Since we are appending two bits to the tap select word, we will use a two bit counter 43 as well. In this example, the counter counts both falling and rising edges, which allows for resolution of x rather than 2x as in FIG. 3.

At time 60, a rising edge of the reference clock signal 66 occurs. The rising edge passes through the MUX 41 and is delayed and inverted at delay line 42 for a period D corresponding the initial tap select word of "0010." After this period has elapsed at time 61, a falling edge of the upconverted clock signal 67 will be outputted 47 from the delay line 42, the counter 43 will be incremented by one to "01," and the falling edge signal will also be sent back to the delay line 42. In the mean time, the summer 44 will add the tap select output 48 "0010.01" to the counter 43 "01" to obtain a sum of "0010.10", which will then be truncated to "0010" and sent as a delay control 69 to the delay line 42.

Since the truncated control "0010" is the same as the initial tap select word, the time interval and delay D between times 60 to 61 and 61 to 62 will remain the same. At time 62, a rising edge of the upconverted clock signal 67 will be outputted 47 from the delay line 42, the counter 43 will be incremented by one to "10," and the rising edge signal will also be sent back to the delay line 42 to be delayed and inverted. In the mean time, the summer 44 will add the tap select output 48 "0010.01" to the counter 43 "10" to obtain a sum of "0010.11", which will then be truncated to "0010" and sent as a delay control 69 to the delay line 42.

Since the truncated control "0010" is the same as the initial tap select word, the time interval and delay D between times 62 to 63 will remain the same as the previous intervals. At time 63, a falling edge of the upconverted clock signal will be outputted 47 from the delay line 42, the counter 43 will be incremented by one to "11," and the falling edge signal will also be sent back to the delay line 42 to be delayed and inverted. In the mean time, the summer 44 will add the tap select output 48 "0010.01" to the counter 43 "11" to obtain a sum of "0011.00", which will then be truncated to "0011" and sent as a delay control 69 to the delay line 42.

Since the truncated control "0011" is now higher than the previous control of "0010", an additional delay element x will be added to delay D, and the time interval between times 63 and 64 will be one delay element longer than that between the previous intervals. Thus, in this example, the time interval between time 63 and 64 will be longer than other intervals, resulting in one of the upconverted clock cycles being longer than the others.

Different embodiments may provide further options for adjusting upconverted clock cycle times to better reconcile with reference clock cycles. For example, instead of the counter incrementing every half upconverted clock cycle, the counter may only increment once every upconverted clock cycle, such as at every rising or falling edge. In different embodiments the counter 43 or tap select 48 may reset, increment, decrement, or otherwise change periodically or at every half or full reference clock cycle. Some embodiments may include circuitry to change the bits appended to the N-bit tap select word under different conditions, such as when the upconverted clock cycles corresponding to a reference clock cycle lead or lag the reference clock cycle. Other embodiments may also directly change the tap select word itself, depending on the disparity between the two cycles. Further embodiments may use different combinations of each of these techniques to improve upconverted clock resolution.

Figure 7:
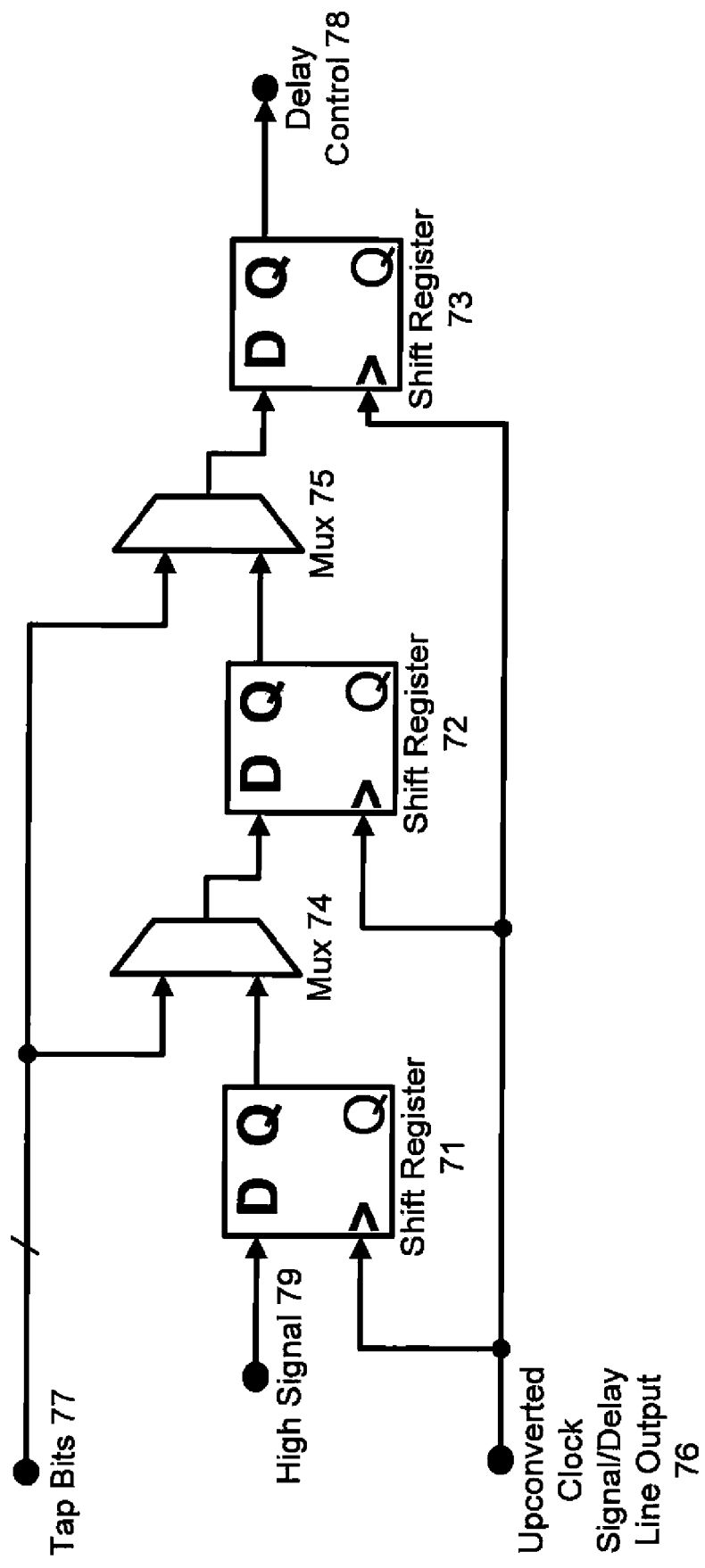
FIG. 7 shows a block diagram of a second embodiment of the invention.

FIG. 7 shows another embodiment for controlling the number of delay elements in different upconverted clock cycles corresponding to a given reference clock cycle. In this embodiment, three shift registers 71, 72, and 73, are activated by and coupled to a upconverted clock signal 76, which may also be a delay line output. The input of first register 71 may be coupled to a steady high signal 79. The output of the first register 71 may be coupled to a first MUX 74 input. Another input of this first MUX 74 may be coupled to a source supplying tap select bits 77. These tap select bits 77 may be similar to the X-bits appended to the N-bit tap select word in a previously described embodiment. In an embodiment, the tap select bits 77 are used to identify the upconverted clock cycle(s) within a corresponding reference clock cycle that will have a longer period or upconverted clock cycle time than the other upconverted clock cycles in the corresponding reference clock cycle. In an embodiment, these longer periods or cycle times may be achieved by sending a control signal to a delay line instructing the delay line to add an additional delay element to the path of a signal, thereby increasing the delay of the signal and lengthening the period or cycle time.

In an embodiment, the output of the first MUX 74 may be coupled to the input shift register 72 and the output of shift register 72 may be coupled to an input of second MUX 75. Another input of the second MUX 75 may also be coupled to the source supplying tap select bits 77. The output of the second MUX 75 may be coupled to a third shift register 73, and the output of the third shift register 73 may coupled to a delay control 78 of a delay line.

In other embodiments, one or more additional muxes and shift registers may be added between the second shift register 72 and second MUX 75. In these embodiments, a first input of an additional MUX may coupled to the output of the preceding shift register, a second input of the MUX may coupled to the source supplying tap select bits, an output of the MUX may be coupled to an input of an additional shift register, the output of the additional shift register may be coupled to the input of the following MUX, and the shift register may be activated by and coupled to the upconverted clock or delay line output 76. Other embodiments may comprise a long chain of muxes and shift registers coupled together as described.

Figure 8:
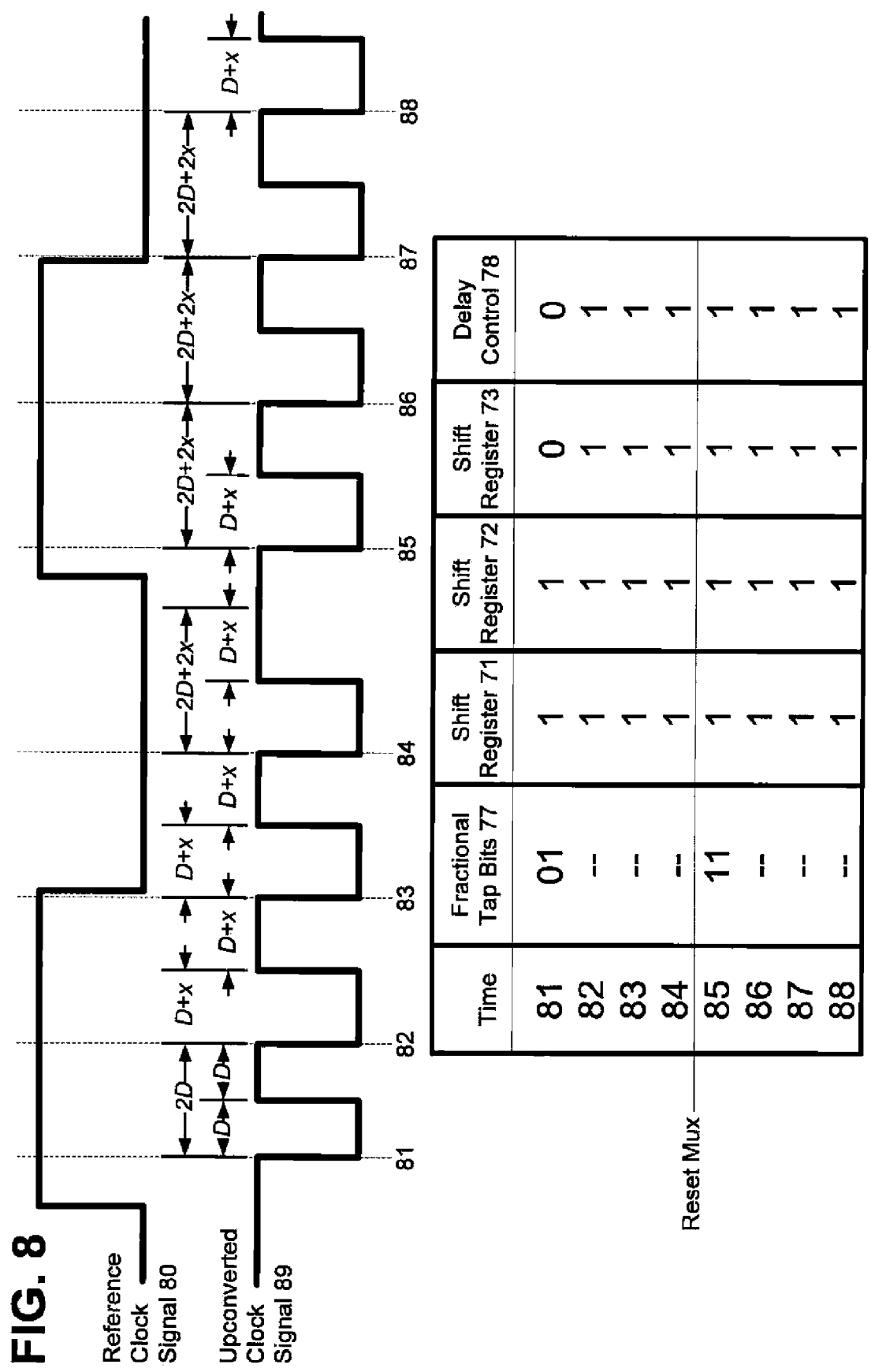
FIG. 8 shows an exemplary upconverted clock output signal corresponding to a reference dock signal together with changes in bit values over time of various elements of the embodiment in FIG. 6.

FIG. 8 contains a chart showing the register value and output changes over time for controlling the number of delay elements in different upconverted clock cycles corresponding to a given reference clock cycle using the embodiment shown in FIG. 7. In FIG. 8, an upconverted clock output signal 89, corresponding reference clock signal 80, and chart showing register changes over time is shown for an embodiment with 2-bit tap select bits "01" in one reference clock cycle and 2-bit tap select bits "11" in the next reference clock cycle.

In an embodiment with 2-bit tap "01", a fall in the upconverted clock signal 89 at time 81 may activate each of the shift registers 71, 72, and 73. Since the input of shift register 71 is a high signal, the first register 71 will output a "1." The muxes 74 and 75 may be configured to initially couple the tap select bits 77 to the input of the second and third registers 72 and 73. In this case, the third register 73 will output the first bit of the two bit "01" tap select bits 77, which in this case is a "0," while the second register 72 will output the second tap select bit 77, which is a "1". The output to delay control 78 from the third register 73 will thus be a zero, and the existing delay element configuration will be used.

At time 82, a second fall in the upconverted clock signal 85 may again activate each of the shift registers 71, 72, and 73. Since the input of shift register 71 is a high signal, the first register 71 will output a "1." The second bit "1" of the two bit tap select bits 77 may be shifted from the output of the second register 72 to the output of the third register 73 and the delay control 78. The output to delay control 78 from the third register 73 will thus be a "1", thereby instructing the delay control 78 to add an additional delay element further delaying the signal and increasing the upconverted clock cycle time for this interval. The bit "1" continues to propagate through shift registers 71, 72, and 73 at times 83 and 84 until the muxes 74 and 75 are triggered to reset by the rise in the reference clock signal 80 between time 84 and 85. In an embodiment, the muxes 74 and 75 may be reset after the last falling edge of the upconverted clock or at the beginning of the next reference clock cycle. Upon reset, muxes 74 and 75 continue coupling the tap select bits 77 to the inputs of the second and third registers 72 and 73, instead of coupling the input of the second and third registers 72 and 73 to the outputs of the first and second registers 71 and 72. In an embodiment, when the muxes 74 and 75 are reset, they may be coupled to a new set of tap select bit 77, such as "11" instead of "01" to increase delay when the upconverted clock signal 89 lags the reference clock signal 80.

Once the muxes 74 and 75 are reset with tap select bits 77 between time 84 and 85, a fall in the upconverted clock signal 89 at time 85 may again activate each of the shift registers 71, 72, and 73. Since the input of shift register 71 is a high signal, the first register 71 will output a "1." The reset muxes 74 and 75 may couple the tap select bits 77 to the input of the second and third registers 72 and 73. In this case, the third register 73 will output the second bit "1" of the two bit "11" tap select bits 77, while the second register 72 will output the first bit, which, in this case, is also "1." The output to delay control 78 from the third register 73 will thus be a "1", and an additional delay element "x" will be added to the existing delay element configuration. The delay control 78 remains at "1" as "1" is propagated through shift registers 71, 72, and 73 at every falling edge of the upconverted clock signal 89, thereby instructing the delay control 78 to keep the additional delay element for each upconverted clock cycle 86, 87, and 88 in the second reference clock period of signal 80.

Figure 9:
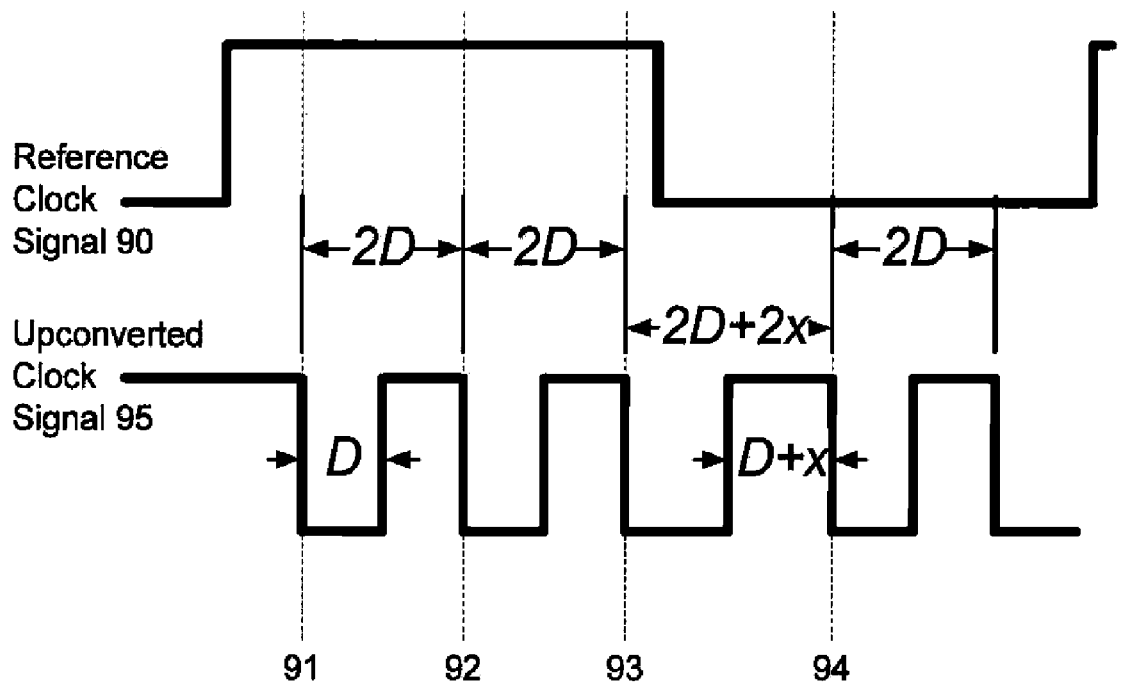
FIG. 9 shows a second exemplary upconverted clock output signal corresponding to a reference clock signal together with changes in bit values over time of various elements of the embodiment in FIG. 6.

FIG. 9 contains a chart showing the register value and output changes over time for controlling the number of delay elements in different upconverted clock cycles corresponding to a given reference clock cycle using the embodiment shown in FIG. 7. In FIG. 9, an upconverted clock output signal 95, corresponding reference clock signal 21 and chart showing register changes over time is shown for an embodiment with 2-bit tap select bits "00."

In an embodiment with 2-bit tap "00", a fall in the upconverted clock signal 95 at time 91 may activate each of the shift registers 71, 72, and 73. Since the input of shift register 71 is a high signal, the first register 71 will output a "1." The muxes 74 and 75 may be configured to initially couple the tap select bits 77 to the input of the second and third registers 72 and 73. In this case, these registers will each output a "0" corresponding to the two bit "00" tap select bits 77. The output to delay control 78 from the third register 73 will thus be a zero, and the existing delay element configuration will be used.

At time 92, a second fall in the upconverted clock signal 95 may again activate each of the shift registers 71, 72, and 73. Since the input of shift register 71 is a high signal, the first register 71 will output a "1." The previous output "1" of the first register 71 will also be shifted through and outputted from the second shift register 72 as a "1", while the previous output "0" of the second register 72 will be shifted to the output of the third register 73 and the delay control 78. The output to delay control 78 from the third register 73 will thus be a "0," and the existing delay element configuration will be used.

At time 93, a third fall in the upconverted clock signal 85 may again activate each of the shift registers 71, 72, and 73. Since the input of shift register 71 is a high signal, the first register 71 will output a "1." Since the previous output of the first and second registers 71 and 72 were both "1", the shifted output of the second and third registers will also be "1". The output to delay control 78 from the third register 73 will thus be a "1", thereby instructing the delay control 78 to add an additional delay element further delaying the signal and increasing the upconverted clock cycle time for this interval.

In an embodiment, muxes 74 and 75 may also be reset in the middle of a reference clock cycle in order to place the wider upconverted clock cycles at different locations during the reference clock period. Another method of varying the location of the wider upconverted clock cycles may be loading in different patterns for tap select bits 77. At time 94, the muxes 74 and 75 are reset before the beginning of the next reference clock cycle and muxes 74 and 75 may again couple the tap select bits 77 to the inputs of the second and third registers 72 and 73. In this case, the third register 73 will output the second bit "0" of the two bit "00" tap select bits 77, while the second register 72 will output the first bit, which in this case is a "0." The output to delay control 78 from the third register 73 will thus be a zero, and the existing delay element configuration will be used.

Different embodiments may provide further options for adjusting upconverted clock cycle times to better reconcile with reference clock cycles. For example, some embodiments may include circuitry to change the tap select bits 77 under different conditions, such as when the upconverted clock cycles corresponding to a reference clock cycle lead or lag the reference clock cycle. Other embodiments may also further adjust the number of delay elements depending on whether the upconverted clock cycles corresponding to a reference clock cycle lead or lag the reference clock cycle. Further embodiments may use different combinations of each of these techniques to improve upconverted clock resolution.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, some of the described embodiments may refer to detecting a fall or falling edge of a signal but a rise or rising edge of a signal may be detected instead.

We claim:

1. A device comprising:
   a programmable delay line,
   a switch coupled to an input of the programmable delay line, a reference clock signal, and an output of a delay line; and
   a counting circuit comprising:
      a counter coupled to the output of the delay line;
      a summer coupled to the counter, a tab select signal, and a delay control of the delay line; and
      circuitry to count a quantity of signal edges from the output of the delay line and, upon reaching the counted quantity, send a signal to the delay control to change a delay in the delay line.

2. The device of claim 1, where the tap select signal comprises a quantity of bits appended to a tap select word and the summer comprises circuitry to remove the quantity of appended bits before sending a signal to the delay control.

3. The device of claim 2, where the counter comprises a quantity of bits equal to the quantity of bits appended to the tap select word.

4. The device of claim 1, where the counting circuit further comprises logic to reset at a start of a new reference clock cycle.

5. The device of claim 1, where the bits appended to the tap select word are changed at a start of a new reference clock cycle.

6. The device of claim 1, where the quantity of signal edges to be counted comprises either rising signal edges or falling signal edges.

7. The device of claim 6, where the quantity of signal edges to be counted is less than a reference clock scaling factor.

8. The device of claim 1, where the switch is a multiplexer.

9. The device of claim 1, where the switch combined with the delay line invert signals.

10. A method comprising:
    delaying propagation of a recirculating clock according to a first delay value;
    counting a number of pulse edges delayed for the first delay value;
    summing the counted number of pulse edges and a tap select word, the tap select word comprising a quantity of bits appended thereto;
    removing the quantity of bits from the sum;
    comparing the sum with the removed bits to the tap select word; and
    responsive to a difference between the sum with the removed bits and the tap select word, delaying propagation of the next pulse for a second delay value.

11. The method of claim 10, where responsive to the difference between the sum with the removed bits and the tap select word, the sum with the removed bits is sent to a control of a delay line, the sum with the removed bits instructing the delay line to set the delay of the next pulse to the second delay value.

12. The method of claim 10, further comprising responsive to no difference between the sum with the removed bits and the tap select word, sending the tap select word to a control of a delay line the tap select word instructing the delay line to set the delay of the next pulse to the first delay value.

13. The method of claim 10, where a counter comprising a quantity of bits equal to the quantity of bits appended to the tap select word is used to count the number of pulse edges.

14. The method of claim 10, where the bits in the quantity of bits appended to the tap select word are changed at a start of a new reference clock cycle.

15. The method of claim 10, where the number of pulse edges counted comprises either rising pulse edges or falling pulse edges.

16. The method of claim 15, where the threshold number of pulse edges to be counted is less than a reference clock scaling factor.

17. The method of claim 10, where the counted number of pulse edges is reset at a start of a new reference clock cycle.

* * * * *